United States Patent
Oh et al.

(10) Patent No.: US 6,875,649 B2
(45) Date of Patent: Apr. 5, 2005

(54) METHODS FOR MANUFACTURING INTEGRATED CIRCUIT DEVICES INCLUDING AN ISOLATION REGION DEFINING AN ACTIVE REGION AREA

(75) Inventors: Yong-chul Oh, Suwon (KR); Gyo-young Jin, Anyang (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/686,421

(22) Filed: Oct. 15, 2003

(65) Prior Publication Data

US 2004/0080019 A1 Apr. 29, 2004

Related U.S. Application Data

(62) Division of application No. 10/083,166, filed on Feb. 6, 2002, now Pat. No. 6,683,364.

(30) Foreign Application Priority Data

Jul. 13, 2001 (KR) ........................................ 2001-42355

(51) Int. Cl.[7] .................. H01L 21/8234; H01L 21/331; H01L 29/00; H01L 29/76; H01L 29/94
(52) U.S. Cl. ........................ 438/221; 438/315; 438/361; 257/510; 257/506; 257/397; 257/514; 257/515; 257/374
(58) Field of Search ................................ 438/221, 315, 438/361; 257/396, 397, 510, 514, 374, 520, 524, 506, 515

(56) References Cited

U.S. PATENT DOCUMENTS

| | | | | |
|---|---|---|---|---|
| 5,747,866 A | * | 5/1998 | Ho et al. ..................... | 257/506 |
| 5,963,822 A | * | 10/1999 | Saihara et al. .............. | 438/481 |
| 6,064,104 A | * | 5/2000 | Omid-Zohoor et al. ..... | 257/510 |
| 6,232,646 B1 | * | 5/2001 | Sun et al. ................... | 257/520 |
| 6,613,645 B2 | * | 9/2003 | Fukaura ...................... | 438/424 |

FOREIGN PATENT DOCUMENTS

KR          99-017696          3/1999

OTHER PUBLICATIONS

Notice to Submit Response for corresponding Korean Application No. 10–2001–0042355 dated May 29, 2003 (English Translation).

* cited by examiner

*Primary Examiner*—Eddie Lee
*Assistant Examiner*—Samuel A Gebremariam
(74) *Attorney, Agent, or Firm*—Myers Bigel Sibley & Sajovec

(57) ABSTRACT

Integrated circuit devices including an isolation region are provided. The devices include an integrated circuit substrate and a trench in the integrated circuit substrate that defines an active region of the integrated circuit device. A silicon layer is provided on the integrated circuit substrate that extends over an edge of the trench and along an upper portion of a first sidewall of the trench. An insulating material is positioned adjacent the silicon layer that extends across some, or all, of the trench to define the isolation region. Methods of forming such integrated circuit devices are also provided.

17 Claims, 4 Drawing Sheets

METHODS FOR MANUFACTURING INTEGRATED CIRCUIT DEVICES INCLUDING AN ISOLATION REGION DEFINING AN ACTIVE REGION AREA

RELATED APPLICATIONS

This application claims priority to and is a divisional of parent application Ser. No. 10/083,166, filed Feb. 26, 2002 now U.S. Pat. No. 6,683,364, which claims the benefit of Korean Patent Application No. 2001-42355, filed Jul. 13, 2001, the disclosures of which are hereby incorporated herein by reference.

BACKGROUND OF THE INVENTION

The present invention relates to integrated circuit devices and more particularly integrated circuit devices including isolated active regions and methods for manufacturing the same.

Various integrated circuit devices, including semiconductor memory devices, include a plurality of active regions in which one or more devices, such as transistors, are formed. In general, isolation regions are provided to define these active regions and to electrically isolate the active regions from each other. Various approaches to providing such isolation regions are known, including local oxidation of silicon (LOCOS) and a trench method. In particular, it is known to use shallow trench isolation (STI), which may be used to provide a larger active region than other trench methods.

Nonetheless, as the integration density of integrated circuit devices increases, even when STI is used to provide isolation regions, the area of active regions occupied by individual devices can decrease geometrically. When the area of active regions occupied by individual devices decreases, and the individual devices are short-channel transistors, a reverse narrow width effect may result as the threshold voltage for the active regions may also rapidly decrease. More particularly, when the area of an active region becomes narrower, a corner transistor (i.e., a transistor formed at an edge of the active region) may use a larger percentage of the active region than a flat transistor (i.e., a transistor formed at the center of the active region). Because the threshold voltage $Vt_1$ of the corner transistor (Corner Tr.), as shown in FIG. 1, is typically lower than the threshold voltage $Vt_2$ of the flat transistor (Flat Tr.), the characteristic threshold voltage of transistors formed on the active region generally becomes lower. It is this lowered characteristic threshold voltage result that is referred to herein as the reverse narrow width effect.

One proposed method to prevent or reduce such a reverse narrow width effect is channel ion implantation, where ions are implanted into the channel region of a transistor. However, the use of channel ion implantation may deteriorate the static refresh characteristics of an integrated circuit device, such as a dynamic random access memory (DRAM).

An alternative approach is to decrease the area of the isolation region. However, using such an approach, the isolation region may fail to provide the desired dielectric characteristics between active regions. One known method for controlling the dielectric characteristics of an isolation layer, while relatively increasing the area of an active region, will now be described with reference to FIGS. 2A and 2B.

As shown in the cross-sectional schematic diagram of FIG. 2A, a pad oxide layer 12 and a silicon nitride layer 14 are sequentially deposited on an integrated circuit (semiconductor) substrate 10. Predetermined portions of the silicon nitride layer 14 and the pad oxide layer 12 are patterned to expose an area on which an isolation layer will be formed. Next, a predetermined material layer is deposited over the integrated circuit substrate 10. This material layer is patterned so as to be left only at the sidewalls of the silicon nitride layer 14 and the pad oxide layer 12 to form spacers 16. The material layer used in forming the spacers 16 may be, for example, a silicon nitride layer or a polyimide layer that has superior etching selectivity with respect to a silicon or silicon oxide layer. The integrated circuit substrate 10 is then etched to a predetermined depth using the pad oxide layer 12, the silicon nitride layer. 14, and the spacers 16 as an etching mask, thereby forming a trench 18.

As shown in FIG. 2B, an insulating layer 19 is deposited on the integrated circuit substrate so that the trench 18 is filled with the insulating layer 19 to a desired depth. The insulating layer 19, the silicon nitride layer 14, the pad oxide layer 12 and the spacers 16 are then chemically and/or mechanically polished, until the surface of the semiconductor substrate 10 is exposed, to form an isolation layer.

The isolation region formed using such a conventional manufacturing method may have various problems. For example, because the spacers 16 are formed of a layer having superior etching selectivity with respect to a silicon or silicon oxide layer, as described above, there typically will also be a difference in polishing selectivity between the spacers 16, the pad oxide layer 12, and the insulating layer 19. This may create problems when polishing the insulating layer 19 filling the trench 18, the silicon nitride layer 14, the pad oxide layer 12, and the spacers 16 as, in order to expose the surface of the integrated circuit substrate 10, the amount of polishing typically will have to be selected to remove the spacers 16, which have a relatively low polishing selectivity.

Due to the amount of polishing required to remove the spacers 16, the integrated circuit substrate 10 under the spacers 16 may be damaged. Thus, portions "A" of the integrated circuit substrate adjoining the edge portion of the trench 18 may be removed. As a result, the insulating layer 19 may be buried in these unintentionally removed portions of the integrated circuit substrate 10. Thus, the edge portion of the trench 18 may become part of an active region and the area of the active region may be substantially decreased. In addition, because the thickness of the insulating layer at the edge portion of the trench 18 is relatively thin, an electric field may be concentrated on the thin portion of the insulating layer. As a result, the electrical characteristics of the insulating layer at the edge portion of the trench 18 may deteriorate.

SUMMARY OF THE INVENTION

Embodiments of the present invention include integrated circuit devices including an isolation region. The devices include an integrated circuit substrate and a trench in the integrated circuit substrate that defines an active region of the integrated circuit device. A silicon layer is provided on the integrated circuit substrate that extends over an edge of the trench and along an upper portion of a first sidewall of the trench. An insulating material is positioned adjacent the silicon layer that extends across some, or all, of the trench to define the isolation region. The silicon layer extending over the edge of the trench provides an overhang that may provide an increased area for the corresponding defined active region of the integrated circuit device.

A second silicon layer may be provided on the integrated circuit substrate that extends over a second edge of the trench and along an upper portion of a second sidewall of the trench, opposite the first sidewall of the trench. The insulating material may extend across the trench between the silicon layers. The silicon layers may be epitaxial growth layers. A second insulating layer may be provided filling at least a portion of the trench. The silicon layers extending over the edges of the trench may define overhangs that extend over the second insulating layer. The upper portions of the sidewalls, along which the epitaxial growth layers extend, may have a length between about 400 and about 1000 Angrstroms or selected to be greater than a depth to which devices are to be formed in the active region.

In other embodiments of the present invention, the first and second insulating layers comprise the same material. Alternatively, the first insulating layer may be a high-density plasma (HDP) oxide layer and the second insulating layer may be a polysilazane oxide layer.

In further embodiments of the present invention, the integrated circuit devices further include a themal oxide layer along the sidewalls of the trench between the integrated circuit substrate and the second insulating layer. In addition, a liner may be provided between the thermal oxide layer and the second insulating layer.

In other embodiments of the present invention, methods are provided for forming an integrated circuit device. A trench is formed in an integrated circuit substrate to define an active region of the integrated circuit device. A first insulating layer is formed in the trench to a height providing an exposed upper portion on opposing sidewalls of the trench. A silicon layer, such as a selective epitaxial growth layer, is formed on the integrated circuit substrate and extends over an edge of one of the sidewalls of the trench and along at least a portion of the exposed upper portion of that sidewall. A second insulating layer is formed adjacent the silicon layer and extends across at least a portion of the trench to define an isolation region. The silicon layer may be formed to extend over an edge of each of the sidewalls of the trench and along at least a portion of the exposed upper portion of each of the sidewalls and the second insulating layer may be formed extending across the trench between the portions of the silicon layer extending over the edges.

In further embodiments of the present invention, semiconductor devices are provided including a semiconductor substrate, a trench formed at a predetermined portion of the semiconductor substrate and defining an active region on which devices will be formed, silicon layers formed to extend from the upper corners of the trench to the upper sidewalls of the trench, and an insulating layer formed to fill a space between the silicon layers. The silicon layers may be selective epitaxial growth layers grown at the surface of the active region.

In other embodiments of the present invention, semiconductor devices are provided including a semiconductor substrate, a trench formed at a predetermined portion of the semiconductor substrate and defining an active region on which devices will be formed, selective epitaxial growth (SEG) layers formed on the surface of the active region and at the upper sidewalls of the trench, and an insulating layer formed to fill a space between the SEG layers.

In further embodiments of the present invention, methods are provided for manufacturing a semiconductor device. A trench is formed on a semiconductor substrate to define an active region on which devices will be formed. A first insulating layer is formed to fill the trench to a predetermined thickness. SEG layers are formed by growing the exposed surface of the active region and the sidewalls of the trench to a predetermined thickness. A space between the SEG layers formed at the sidewalls of the trench is formed with a second insulating layer. The trench may be formed by sequentially depositing a pad oxide layer and a mask layer on the semiconductor substrate, patterning predetermined portions of the mask layer and the pad oxide layer, and forming a trench by etching the semiconductor substrate to a predetermined depth using the patterned mask layer and the patterned pad oxide layer as an etching mask. A thermal oxide layer may be formed at the sidewalls of the trench and a liner may be formed on the thermal oxide layer between the step of forming the trench and the step of forming the first insulating layer.

The first insulating layer may be formed by depositing the first insulating layer such that the trench is sufficiently filled with the first insulating layer, chemically and mechanically polishing the mask layer, the pad oxide layer, and the first insulating layer, so that the surface of the semiconductor substrate is exposed, and etching the first insulating layer to a predetermined depth, such that the upper sidewalls of the trench are exposed. The first insulating layer may be etched to a predetermined depth by wet etching. Preferably, the first insulating layer is etched by as much as the depth to which devices will be formed. For example, the first insulating layer may be etched by about 400–1000 Angstroms (Å).

In further embodiments of the present invention, the semiconductor substrate is annealed in a hydrogen atmosphere between etching the first insulating layer and forming the SEG layers or between forming the SEG layers and forming the second insulating layer. The thermal oxide layer may be formed over the entire surface of the semiconductor substrate after annealing the semiconductor substrate in a hydrogen atmosphere.

The space between the SEG layers may be filled with the second insulating layer by depositing a fluid oxide layer so that the space between the SEG layers is sufficiently filled with the fluid oxide layer, heat-treating the fluid oxide layer so that the density of the fluid oxide layer is improved, and etching back the fluid oxide layer. The fluid oxide layer may be a polysilazane oxide layer.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1:
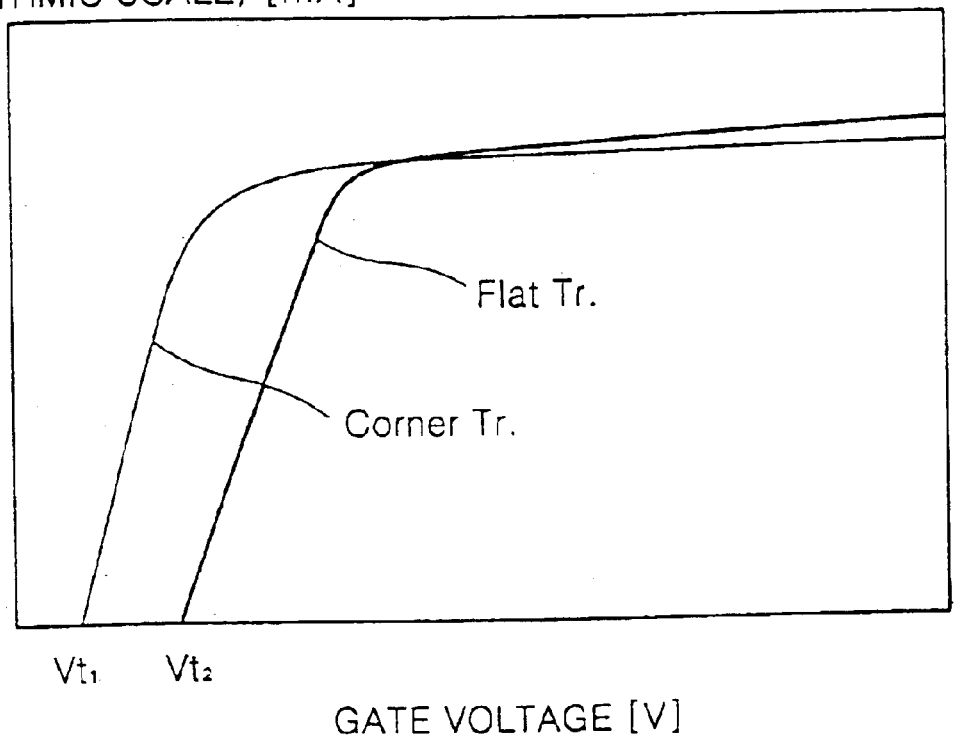
FIG. 1 is, a graph showing threshold voltages for a conventional flat transistor and a conventional corner transistor.
Figure 2A:
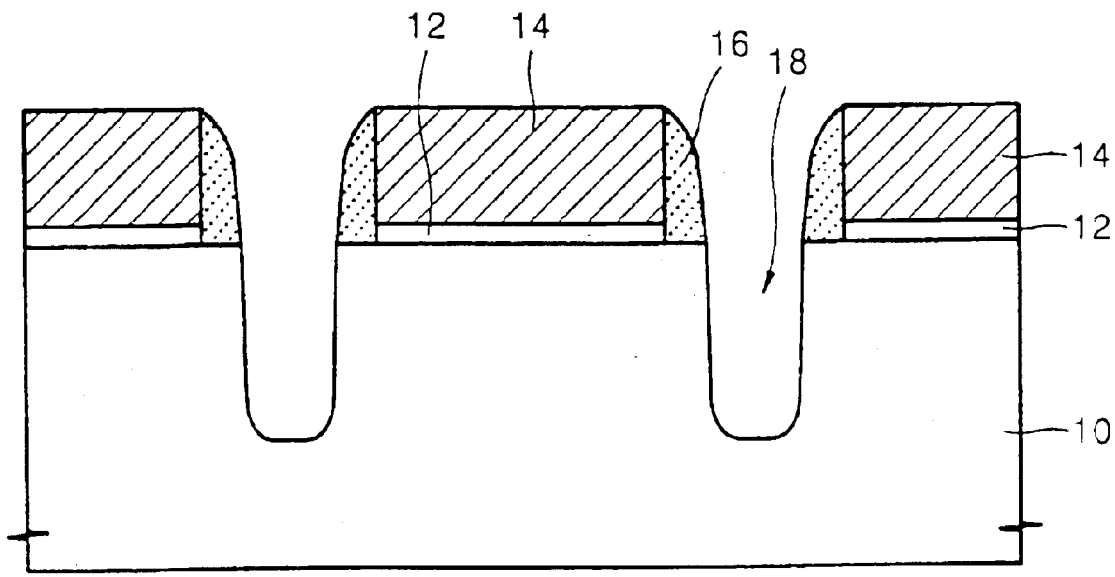
FIGS. 2A and 2B are cross-sectional schematic views illustrating a conventional integrated circuit (semiconductor) device including an isolation region (layer)
Figure 2B:
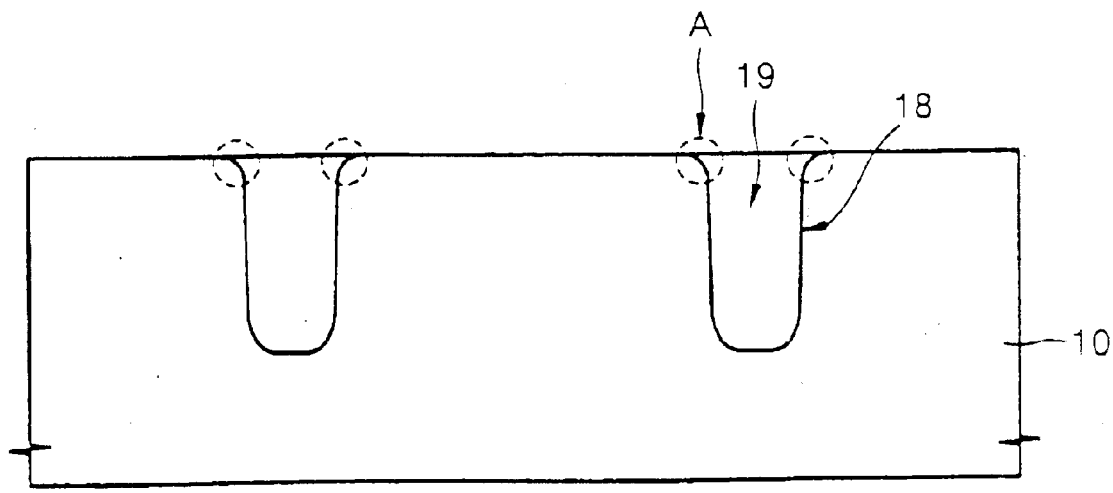

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well. Terms used herein are to be given their ordinary meaning unless explicitly defined otherwise herein.

Figure 3A:
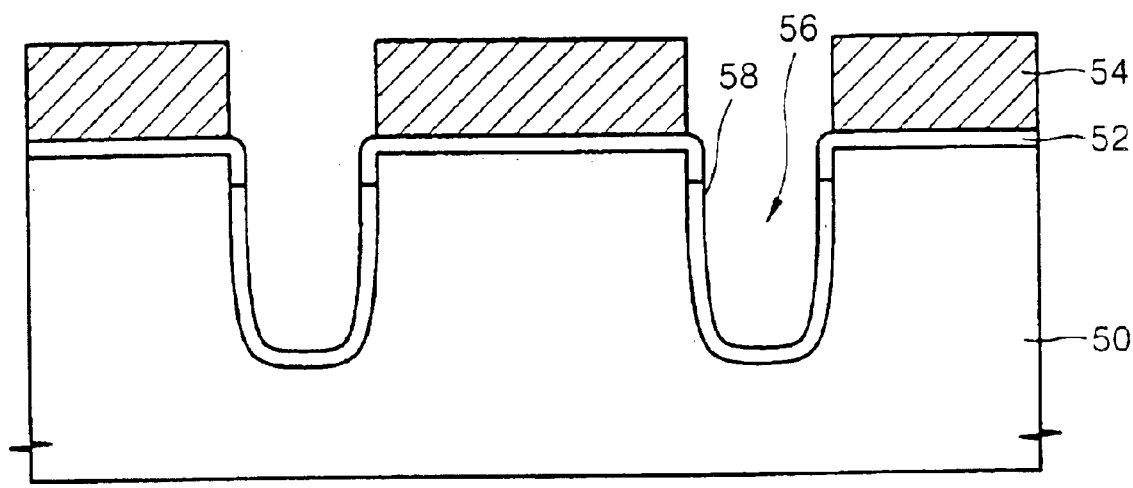
FIGS. 3A through 3D are cross-sectional schematic views illustrating an integrated circuit device and a method for forming the same according to embodiments of the present invention.

Integrated circuit devices and methods for forming such devices in accordance with embodiments of the present invention will now be described with reference to FIGS. 3A–3D. FIG. 3A is a cross-sectional schematic view showing a pad oxide layer 52 and a mask layer 54, which may be sequentially deposited on an integrated circuit substrate 50. For example, the mask layer 54 may be formed of a material having superior etching selectivity with respect to a silicon or silicon oxide layer. The material may be silicon nitride or other suitable material. Selected (predetermined) portions of the mask layer 54 and the pad oxide layer 52 are patterned to expose the area on which an isolation region will be formed. The integrated circuit substrate 50 is etched to a predetermined depth to form a trench 56 using the patterned mask layer 54 and pad oxide layer 52 as an etching mask. The trench 56 may be formed as a shallow trench. A surface oxide layer 58 is formed by oxidizing the surface of the trench 56. The surface oxide layer 58 may be formed by thermal oxidation to improve or recover portions on the surface of the trench 56 that may have been damaged during the etching process.

Figure 3B:
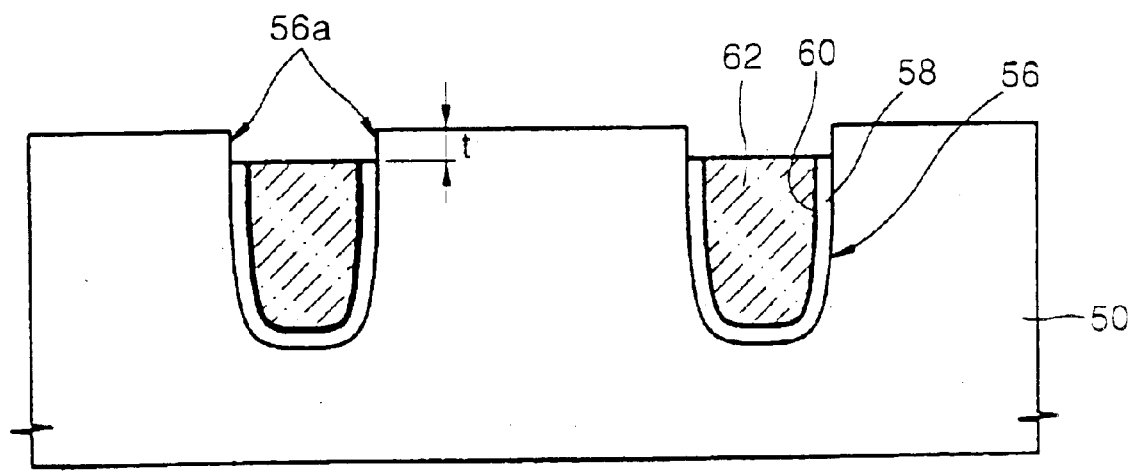

Referring now to FIG. 3B, a liner 60 is formed on the surface oxide layer 58. The liner 60 may be provided to mitigate stresses caused in the integrated circuit device by the difference between the thermal expansion coefficients of the surface oxide layer 58 and an insulating layer partially filling the trench 56. The line 60 may be formed of a silicon nitride layer. The liner 60 may also be a thin layer having, for example, a thickness between about 100 Å and 400 Å. A first insulating layer 62 is formed on the integrated circuit substrate 50 so that the trench 56 is partially filled with a first insulating layer 62. For example, the first insulating layer 62 may be formed in the trench 56 to a height providing an exposed upper portion on opposing sidewalls of the trench 56 of a desired length. The desired length may be provided by a subsequent etching operation after depositing the insulating layer as will be described below. The upper portions of the opposing sidewalls of the trench 56, in various embodiments of the present invention, have a length of between about 400 and about 1000 Angstroms (Å). The first insulating layer 62 may be formed of a high-density plasma (HDP) oxide layer.

The first insulating layer 62, the mask layer 54, and the pad oxide layer 52 are chemically and mechanically polished to expose the surface of the integrated circuit substrate 50. In other words, the pad oxide layer 52 and the mask layer 54 are completely removed, and the first insulating layer 62 is only present in the trench 56 after polishing. The first insulating layer 62 and the liner 60 may be etched to a predetermined depth by wet etching using a chemical solution to complete forming of the first insulating layer 62. As shown in FIG. 3B, after removing a determined amount of the first insulating layer 62 and the liner 60, a desired step height difference "t" is provided between the top of the first insulating layer 62 and the integrated circuit substrate 50. Therefore, the upper sidewall portions 56a of the trench 56 are exposed. As noted above, "t" may be, for example, about 400–1000 Å.

Figure 3C:
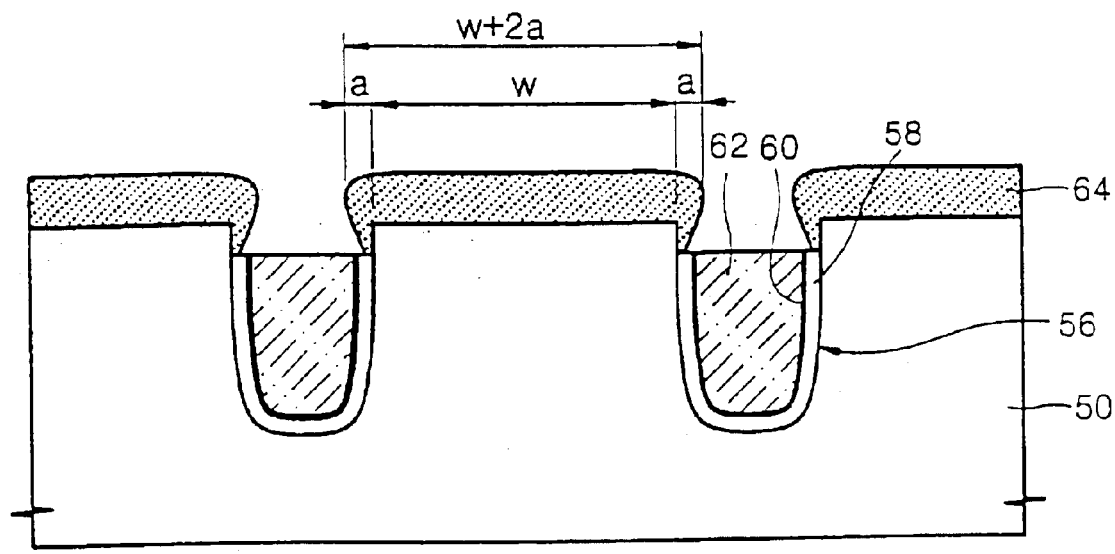

Referring now to FIG. 3C, a silicon layer, preferably, a selective epitaxial growth (SEG) layer 64, is grown on the exposed surface of the integrated circuit substrate 50 extending over the edges and along the upper sidewall portions 56a of the trench 56. The SEG layer 64 may be selected to grow only on silicon-based material or silicon oxide. As a result, the SEG layer 64 may be grown to a predetermined thickness "a" at the upper sidewalls 56a of the trench 56 to introduce an overhang extending over the trench so that the width of a corresponding active region(s) adjacent to and defined by the trench 56a is increased by as much as "2a." As shown in FIG. 3C, "W" is the original width of the active region before the growth of the SEG layer 64, which corresponds to the width provided the active region in a conventional integrated device with trench isolation. As the width of the active region may be increased by as much as the overhang of the SEG layer 64 in various embodiments of the present invention, the area of the active region may also be increased.

Furthermore, for the embodiments illustrated in FIG. 3C, as the SEG layer 64 is formed only at the upper sidewall portions 56a of the trench 56, the width of the trench 56 need not be decreased at other depths. As a result, the performance of the isolation region may not be decreased and the dielectric characteristics of the isolation region may not be affected as there is, effectively, no decrease in the width of the isolation region.

To reduce or eliminate defects in the SEG layer 64, the integrated circuit substrate 50 may be annealed in a hydrogen atmosphere, either before or after forming the SEG layer 64. Furthermore, after annealing the integrated circuit substrate 50, a layer of the same material as the first insulating layer 62, for example, an oxide layer, may be grown to a predetermined thickness on the integrated circuit substrate 50. This approach may also improve defect curing characteristics in the integrated circuit device.

Figure 3D:
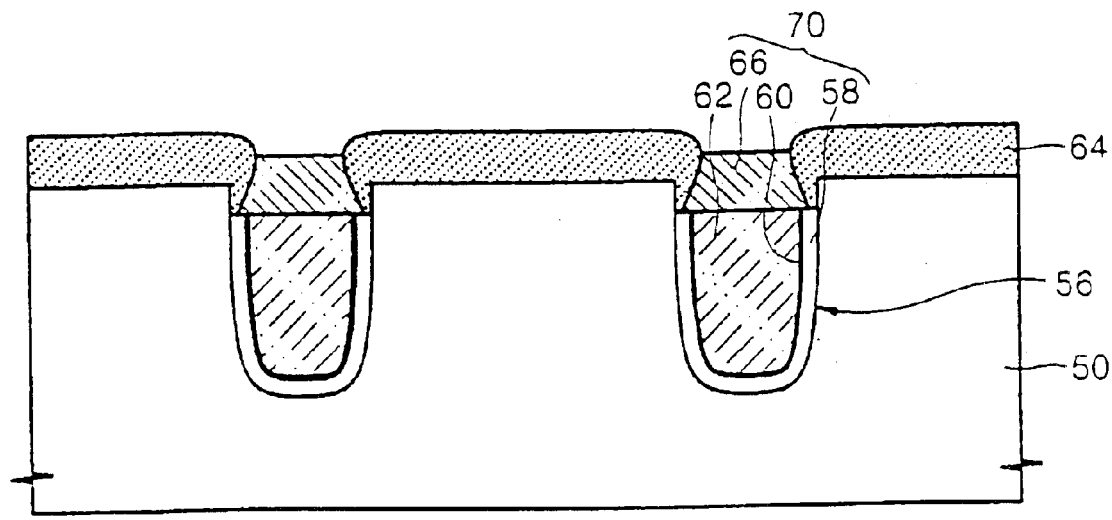

As shown in FIG. 3D, a second insulating layer 66 is also formed in, and at least partially filling, a space between the adjacent SEG layers 64 formed at the edges of and along the upper sidewall portions 56a of the trench 56. The second insulating layer 66 may be a polysilazane oxide layer having an associated fluidity. It will be understood that polysilazane typically has good gap-filling characteristics and superior tolerance of wet chemicals. Also, polysilazane generally has a high etching selectivity of SiN (8.3:1) and maybe formed by a simple process. Polysilazane may be transformed into $SiO_2$ in a wet atmosphere, however, it is generally not transformed into $SiO_2$ in a wet or $N_2$ atmosphere. When a polysilazane oxide layer is used as the second insulating layer 66, the integrated circuit substrate 50 may be annealed at a predetermined temperature to increase the density of the second insulating layer 66. After annealing, the second insulating layer 66 may be etched back by wet or dry etching so that the surface of the SEG layer 64 is exposed and the trench 56 is filled with the first and second insulating layers 62 and 66. Thus, the present invention provides a method for implementing a shallow trench isolation (STI) region 70 in an integrated circuit device.

As described above, various embodiments of the present invention provide integrated circuit devices and methods for forming the same in which an insulating layer is formed to fill a trench to a predetermined height, after which a SEG layer is grown to a predetermined thickness on the surface of an exposed active region and along the upper sidewalls of the trench. A space between adjacent SEG layers formed at the upper sidewalls of the trench is filled with an insulating layer to finish forming the STI isolation region.

As the SEG layer is formed at the upper sidewalls of the trench, the width of an active region may be increased with no or only minimal affect on the dielectric characteristics of the STI. Accordingly, the edge of the STI can be prevented from extending toward the active region, the width and, thus, the area, of the active region may be increased. As such, various embodiments of the present invention may be utilized to beneficially address the problem of a reverse narrow width effect.

It should be noted that many variations and modifications can be made to the embodiments described above without substantially departing from the principles of the present invention. All such variations and modifications are intended to be included herein within the scope of the present invention, as set forth in the following claims.

We claim:

1. A method for forming an integrated circuit device, comprising:
    forming a trench in an integrated circuit substrate to define an active region of the integrated circuit device;
    forming a first insulating layer in the trench to a height providing an exposed upper portion on opposing sidewalls of the trench;
    forming a silicon layer on the integrated circuit substrate and extending over an edge of one of the sidewalls of the trench and along at least a portion of the exposed upper portion of the one of the sidewalls to define an overhang that provides an increased area for the corresponding defined active region of the integrated circuit device; and
    forming a second insulating layer adjacent the silicon layer and extending across at least a portion of the trench to define an isolation region.

2. A method for forming an integrated circuit device, comprising:
    forming a trench in an integrated circuit substrate to define an active region of the integrated circuit device;
    forming a first insulating layer in the trench to a height providing an exposed upper portion on opposing sidewalls of the trench;
    forming a silicon layer on the integrated circuit substrate and extending over an edge of one of the sidewalls of the trench and along at least a portion of the exposed upper portion of the one of the sidewalls;
    forming a second insulating layer adjacent the silicon layer and extending across at least a portion of the trench to define an isolation region; and
    wherein the step of forming the silicon layer comprises the step of forming the silicon layer on the integrated circuit substrate and extending over an edge of each of the sidewalls of the trench and along at least a portion of the exposed upper portion of each of the sidewalls and wherein the step of forming a second insulating layer comprises the step of forming the second insulating layer extending across the trench between the portions of the silicon layer extending over the edges.

3. The method of claim 2 wherein the silicon layers are epitaxial growth layers.

4. The method of claim 3 wherein the step of forming a first insulating layer further comprises the step of forming the first insulating layer to provide the upper portions of the sidewalls, along which the epitaxial growth layers extend, a length between about 400 and about 1000 Angrstroms.

5. The method of claim 3 wherein the first and second insulating layers comprise the same material.

6. The method of claim 3 wherein the first insulating layer comprises a high-density plasma (HDP) oxide layer and the second insulating layer comprises a polysilazane oxide layer.

7. The method of claim 3 wherein the step of forming a first insulating layer further comprises the step of forming the first insulating layer to provide the upper portions of the sidewalls, along which the epitaxial growth layers extend, a length selected to be greater than a depth to which devices are to be formed in the active region.

8. The method of claim 3 further comprising:
    forming a themal oxide layer along the sidewalls of the trench between the integrated circuit substrate and the second insulating layer; and
    forming a liner between the thermal oxide layer and the second insulating layer.

9. A method for manufacturing a semiconductor device comprising:
    forming a trench on a semiconductor substrate to define an active region on which devices will be formed;
    forming a first insulating layer such that a predetermined thickness of the trench is filled with the first insulating layer;
    forming selective epitaxial growth (SEG) layers by growing the exposed surface of the active region and the sidewalls of the trench to a predetermined thickness;
    filling a space between the SEG layers formed at the sidewalls of the trench with a second insulating layer;
    forming a thermal oxide layer at the sidewalls of the trench; and
    forming a liner on the thermal oxide layer between the step of forming the trench and the step of forming the first insulating layer;
    wherein forming the first insulating layer comprises:
    depositing the first insulating layer such that the trench is sufficiently filled with the first insulating layer;
    chemically and mechanically polishing the mask layer, the pad oxide layer, and the first insulating layer so that the surface of the semiconductor substrate is exposed; and
    etching the first insulating layer to a predetermined depth such that the upper sidewalls of the trench are exposed, wherein in etching the first insulating layer, predetermined portions of the thermal oxide layer and the liner are etched.

10. The method of claim 9, wherein forming the trench comprises:
    sequentially depositing a pad oxide layer and a mask layer on the semiconductor substrate;
    patterning predetermined portions of the mask layer and the pad oxide layer; and
    forming a trench by etching the semiconductor substrate to a predetermined depth using the patterned mask layer and the patterned pad oxide layer as an etching mask.

11. The method of claim 9, wherein the first insulating layer is etched by wet etching.

12. The method of claim 9, wherein the first insulating layer is etched by as much as the depth to which devices will be formed.

13. The method of claim 12, wherein the first insulating layer is etched by about 400–1000 Å.

14. The method of claim 9 further comprising:

annealing the semiconductor substrate in a hydrogen atmosphere between etching the first insulating layer and forming the SEG layers or between fanning the SEG layers and filling the space between the SEG layers formed at the sidewalls of the trench.

15. The method of claim 14 further comprising forming a thermal oxide layer over the entire surface of the semiconductor substrate after annealing the semiconductor substrate in a hydrogen atmosphere.

16. A method for manufacturing a semiconductor device comprising:

forming a trench on a semiconductor substrate to define an active region on which devices will be formed;

forming a first insulating layer such that a predetermined thickness of the trench is filled with the first insulating layer;

forming selective epitaxial growth (SEG) layers by growing the exposed surface of the active region and the sidewalls of the trench to a predetermined thickness; and filling a space between the SEG layers formed at the sidewalls of the trench with a second insulating layer; and wherein filling the space between the SEG layers with the second insulating layer comprises:

depositing a fluid oxide layer so that the space between the SEG layers is sufficiently filled with the fluid oxide layer;

heat-treating the fluid oxide layer so that the density of the fluid oxide layer is improved; and etching back the fluid oxide layer.

17. The method of claim 16, wherein the fluid oxide layer is a polysilazane oxide layer.

* * * * *

UNITED STATES PATENT AND TRADEMARK OFFICE
CERTIFICATE OF CORRECTION

PATENT NO. : 6,875,649 B2
DATED : April 5, 2005
INVENTOR(S) : Oh et al.

It is certified that error appears in the above-identified patent and that said Letters Patent is hereby corrected as shown below:

<u>Column 9,</u>
Line 9, should read -- and forming the SEG layers or between forming the --.

Signed and Sealed this

Eighth Day of November, 2005

JON W. DUDAS
*Director of the United States Patent and Trademark Office*